United States Patent
Healy et al.

(10) Patent No.: US 8,753,926 B2
(45) Date of Patent: Jun. 17, 2014

(54) ELECTRONIC PACKAGING WITH A VARIABLE THICKNESS MOLD CAP

(75) Inventors: Christopher J. Healy, San Diego, CA (US); Gopal C. Jha, San Diego, CA (US); Vivek Ramadoss, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 12/881,549

(22) Filed: Sep. 14, 2010

(65) Prior Publication Data

US 2012/0061857 A1    Mar. 15, 2012

(51) Int. Cl.
*H01L 21/00*    (2006.01)

(52) U.S. Cl.
USPC ............... 438/127; 438/112; 257/E23.128; 257/730; 257/787

(58) Field of Classification Search
CPC .......... H01L 21/00; H01L 2924/01079; H01L 2924/14; H01L 2224/16
USPC .......... 257/E23.128, 706, 724, 730, 787–796; 438/112, 113, 122–127
See application file for complete search history.

(56) References Cited

U.S. PATENT DOCUMENTS

| | | | |
|---|---|---|---|
| 5,708,300 A * | 1/1998 | Woosley et al. | 257/730 |
| 5,841,192 A * | 11/1998 | Exposito | 257/701 |
| 6,177,724 B1 * | 1/2001 | Sawai | 257/701 |
| 6,340,792 B1 | 1/2002 | Hirokawa | |
| 6,396,159 B1 * | 5/2002 | Shoji | 257/788 |
| 6,413,353 B2 * | 7/2002 | Pompeo et al. | 156/307.3 |
| 6,498,055 B2 * | 12/2002 | Fukuda et al. | 438/127 |
| 6,577,018 B1 | 6/2003 | Tandy et al. | |
| 6,590,152 B1 * | 7/2003 | Horio et al. | 174/354 |
| 6,841,424 B2 * | 1/2005 | Bolken | 438/127 |
| 6,897,550 B1 * | 5/2005 | Zwenger et al. | 257/666 |
| 7,382,046 B2 * | 6/2008 | Tashiro et al. | 257/704 |
| 7,682,869 B2 | 3/2010 | Hong | |
| 7,808,572 B2 * | 10/2010 | Lee et al. | 349/58 |

(Continued)

FOREIGN PATENT DOCUMENTS

| | | | |
|---|---|---|---|
| JP | 58079739 A | 5/1983 | |
| JP | 61114563 A | 6/1986 | |

(Continued)

OTHER PUBLICATIONS

International Search Report and Written Opinion—PCT/US2011/051612—ISA/EPO—Dec. 13, 2011.

*Primary Examiner* — Chris Chu

(74) *Attorney, Agent, or Firm* — Michelle S. Gallardo

(57) ABSTRACT

An electronic package with improved warpage compensation. The electronic package includes a mold cap having a variable thickness. The variable thickness can have a mound or dimple design. In another embodiment, a method is provided for reducing unit warpage of an electronic package by designing the topography of a mold cap to compensate for warpage.

17 Claims, 3 Drawing Sheets

(56) References Cited

U.S. PATENT DOCUMENTS

| | | | |
|---|---|---|---|
| 7,956,475 B2 * | 6/2011 | Goh et al. | 257/787 |
| 8,030,672 B2 * | 10/2011 | Harada | 257/88 |
| 8,067,841 B2 * | 11/2011 | Heng et al. | 257/788 |
| 8,097,965 B2 * | 1/2012 | Takata | 257/787 |
| 2005/0263886 A1 | 12/2005 | Hussa | |
| 2007/0262473 A1 * | 11/2007 | Yim et al. | 257/787 |
| 2008/0153208 A1 | 6/2008 | Matsunami | |
| 2008/0157402 A1 | 7/2008 | Ramakrishna et al. | |
| 2008/0284045 A1 | 11/2008 | Gerber et al. | |
| 2008/0305576 A1 | 12/2008 | Yu et al. | |
| 2009/0212446 A1 | 8/2009 | Heng et al. | |
| 2010/0148377 A1 | 6/2010 | Ito et al. | |

FOREIGN PATENT DOCUMENTS

| | | |
|---|---|---|
| JP | 10027870 A | 1/1998 |
| JP | 2000323623 A | 11/2000 |
| JP | 2002026194 A | 1/2002 |
| JP | 2002261200 A | 9/2002 |
| JP | 2003218290 A | 7/2003 |
| JP | 2006344898 A | 12/2006 |
| JP | 2008133630 A | 6/2008 |
| JP | 2008166816 A | 7/2008 |
| JP | 2010141261 A | 6/2010 |

* cited by examiner

ELECTRONIC PACKAGING WITH A VARIABLE THICKNESS MOLD CAP

FIELD OF DISCLOSURE

This disclosure relates generally to electronic packaging, and in particular to an electronic package with a variable thickness mold cap.

BACKGROUND

In today's electronic packages, many packages are fabricated as composites of material. In other words, the packages include a combination of various materials that are layered together to form an end product. During manufacturing, assembly, and operation, temperature changes in each material can generate internal stresses therein due to the different mechanical properties of each material. For example, the coefficient of thermal expansion can be different for each material that forms an electronic package, and the thermal mismatch between materials can result in cracking, warpage, etc.

Warpage presents significant design concerns when fabricating an electronic package. The design challenges include surface mount technology yield issues, capability for reduction of solder ball pitch, solder ball stress, and board level reliability. Great effort continues to be put forth towards reducing and/or eliminating warpage in electronic packaging. However, most of these efforts are focused on reducing warpage at the strip level (i.e., before cutting or dicing the packages into singulated, unitary packages). In spite of these efforts, there continue to be concerns and problems with warpage in conventional electronic packaging.

Therefore, it would be desirable to develop an electronic package and method of manufacturing the package which could be designed to compensate for warpage. In particular, it would be desirable to reduce the effects of warpage on a singulated, unitary electronic package.

SUMMARY

For a more complete understanding of the present disclosure, reference is now made to the following detailed description and the accompanying drawings. In an exemplary embodiment, a singulated unitary electronic package is provided with a mold cap having a variable thickness. The mold cap can include a profiled surface. In one form of this embodiment, the mold cap can have a mound design. In another form thereof, the mold cap can have a dimple design. Alternatively, the mold cap can have a mound design and a dimple design. In addition, the surface contour of the mold cap compensates for warpage.

In another embodiment, a method of reducing unit warpage of an electronic package having a substrate is provided. The method includes placing an overmold having a plurality of heights over the electronic package and applying a molding compound between the substrate of the electronic package and the overmold. The method further includes allowing the molding compound to form a mold cap having a plurality of thicknesses. The method can also include varying the thickness of the mold cap. The mold cap thickness can be varied near the center or edge thereof. The method can further include varying the thickness of the mold material based on the underlying components within the package. The stiffness of the package can also be varied.

In a different embodiment, a method is provided for fabricating a singulated unitary electronic package with reduced unit warpage. The method includes providing an electronic package and enclosing the package with a mold material. The surface contour of the mold material is formed to compensate for unit warpage. The electronic package is cut into a plurality of singulated unitary packages. In one form of this embodiment, the method includes varying the thickness of the mold material. In another form thereof, the method includes varying the stiffness of the package. The formed surface contour can be a mound or dimple. Alternatively, the method can include varying the thickness of the mold material based on the underlying components within the package.

The above-described embodiments are advantageous for reducing the effects of warpage on a singulated unitary electronic package. Most conventional electronic packages seek to reduce warpage at the strip level, but are unable to reduce warpage for an individual package. The present invention is able to compensate for warpage by designing a mold cap to encapsulate the singulated unitary electronic package. The design of the mold cap compensates for unit warpage based on the underlying components in the package. The design is flexible to accommodate various packages and therefore is better equipped to reduce the effects of warpage over conventional packages.

DETAILED DESCRIPTION

Figure 1:
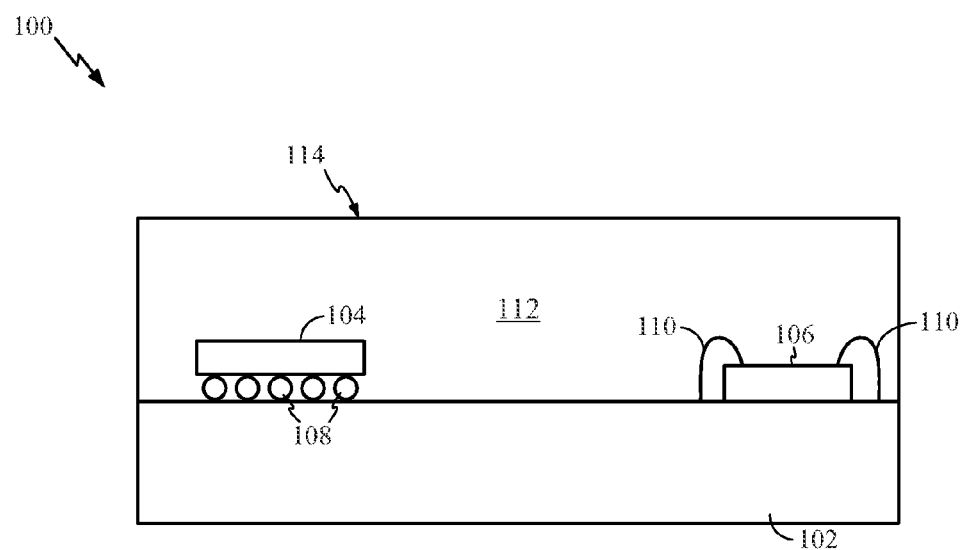
FIG. 1 is a cross-sectional view of a conventional electronic package.

Referring to FIG. 1, a conventional electronic package 100 is shown. The conventional package 100 includes a substrate 102, a first die 104, and a second die 106. The first die 104 is attached to the substrate 102 by a plurality of solder balls or bumps 108. The second die 106 is attached to the substrate 102 by wire bonding 110. In addition, the conventional package 100 includes a mold compound 112 that encloses the first die 104 and second die 106. The mold compound 112 forms an encapsulant, or mold cap 114. As shown, the conventional mold cap 114 is formed having a uniform thickness (i.e., the thickness measured from the substrate 102 to the top of the mold cap 114). Since the package 100 including the mold cap 114 are formed of different materials, warpage and other internal stresses can negatively impact the conventional package 100 and its ability to mount, for example, to a printed circuit board (PCB) or other package.

Figure 2:
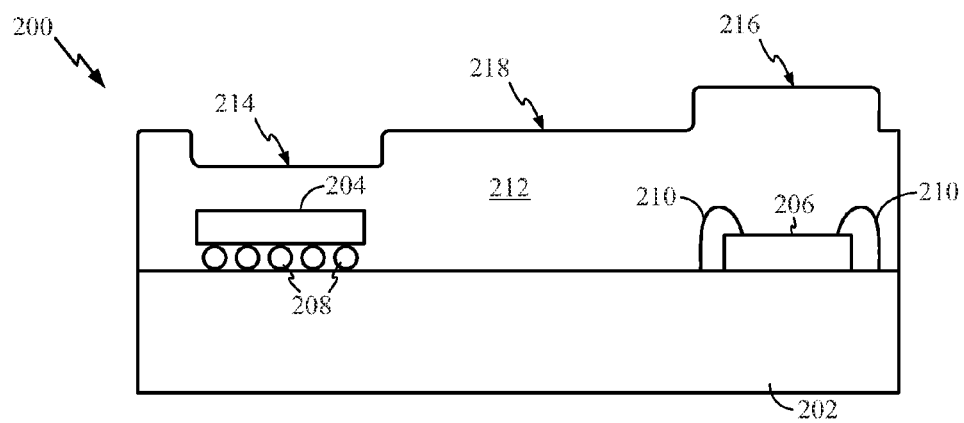
FIG. 2 is a cross-sectional view of a singulated unitary electronic package having a variable thickness mold cap.

In FIG. 2, an exemplary embodiment of an electronic package 200 is shown for overcoming the disadvantages of the prior art. Similar to the conventional package 100 of FIG. 1, the package 200 in FIG. 2 also includes a substrate 202, a first die 204, and a second die 206. The first die 204 can be coupled to the substrate 202, for example, by a plurality of microbumps 208. Likewise, the second die 206 can be coupled to the substrate 202 by wire bonds 210. The presence of the first die 204 and second die 206 in the package 200 are exemplary, and other electronic packages may include additional or different components.

The package 200 can also include a mold compound 212 (i.e., a mold cap) that substantially encloses the first die 204 and the second die 206. During the fabrication and assembly of the package 200, the mold cap 212 is formed by placing an "overmold" over the package 200 and dispensing the mold compound 212 between the package substrate 202 and "overmold" to substantially enclose the package 200. The mold compound 212 can reduce or prevent moisture and other contaminants from affecting the functionality and reliability of the package 200.

Unlike conventional packages, the mold cap of the package 200 in FIG. 2 can be designed to have a variable thickness. Referring to FIG. 2, for example, the mold cap can be formed to include different portions. In a first portion 214, the mold cap can have a smaller thickness, whereas in a second portion 216 the mold cap can have a greater thickness. In a third portion 218, the mold cap can have a thickness that is greater than the thickness of the first portion 214 but less than the thickness of the second portion 216. In other embodiments, the mold cap can have a plurality of portions having different thicknesses.

The thickness of each portion of the mold cap can be designed to compensate for warpage that is predicted to occur at that particular location of the package. Referring to FIG. 2, the first die 204 and second die 206 can cause the package 200 to warp. To compensate for the warpage caused by the first die 204, the first portion 214 of the mold cap is formed defining a cavity, dimple, or recess. The depth of the cavity, for example, can be designed to compensate for a predetermined amount of warpage. The ability to predetermine the amount of warpage a package may undergo can be achieved by modeling and testing prototypes prior to fabricating the package.

In FIG. 2, the mold cap is also designed to compensate for warpage caused by the second die 206. In this embodiment, the second portion 216 of the mold cap has an increased thickness (e.g., mound-shaped). The height or amount of increased thickness of the second portion 216 is designed to compensate for a predetermined amount of warpage. Prototype electronic packages are modeled and tested to determine how a package may warp and the amount of warpage.

Figure 3:
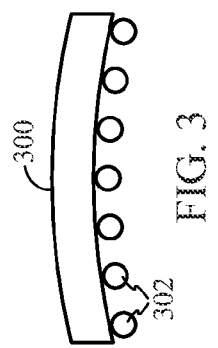
FIG. 3 is a schematic view of an electronic package affected by convex warpage.

Turning to FIG. 3, a die 300 is provided having a plurality of solder balls 302 attached thereto. As shown, the die 300 can warp in a convex manner (i.e., "positive direction" warpage) such that the solder balls 302 near the middle of the die 300 detach from a package substrate (not shown).

Figure 4:
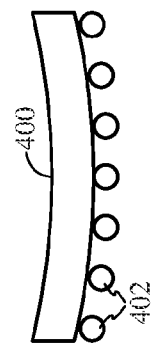
FIG. 4 is a schematic view of an electronic package affected by concave warpage.

Conversely, in FIG. 4, a similar die 400 is provided having a plurality of solder balls 402 attached thereto. In this embodiment, the die 400 can warp in a concave manner (i.e., "negative direction" warpage). As such, the solder balls 402 near each end of the die 400 can detach from a package substrate (not shown).

Figure 5:
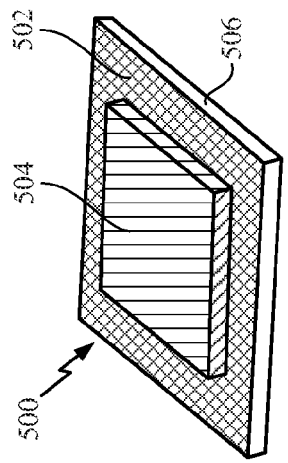
FIG. 5 is a perspective view of a mound-shape mold cap.

Referring to FIG. 5, an exemplary embodiment for compensating for "positive direction" warpage or "negative direction" warpage is shown. In this embodiment, an electronic package 500 includes a mold cap 502 that substantially covers or encloses underlying components 506 (e.g., a die, a substrate, another package, etc.). The mold cap 502 can be formed of an epoxy-based material or other known mold compound material.

In FIG. 5, the mold cap 502 includes a mound-shaped design 504 (i.e., an increased thickness near the center of the package). The increased thickness of the mold cap 502 can increase the stiffness of the package and thereby overcome or resist internal stresses in this location of the package. A die, for example, can be positioned near the center of the package 500 and covered or enclosed by the mold cap 502. Through modeling and other testing, it may be determined that the die will cause the package 500 to warp near the center thereof. Thus, the mold cap 502 can be designed with an increased thickness 504 at the center of the package 500 to increase the stiffness of the package 500 and compensate for possible warpage. In addition, this design can compensate for either "positive direction" or "negative direction" warpage.

Figure 6:
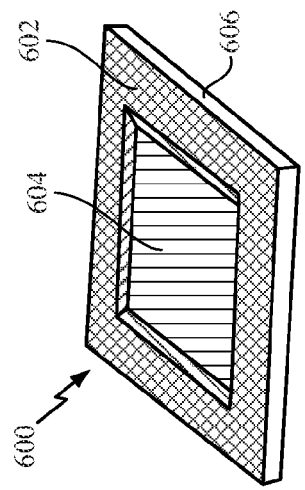
FIG. 6 is a perspective view of a dimple-shape mold cap.

Referring to FIG. 6, another embodiment of an electronic package 600 is provided. The electronic package 600 can include a mold cap 602 that substantially covers or encloses underlying components 606 (e.g., a die, a substrate, etc.). The mold cap 602 can be formed of an epoxy-based material or other known mold compound material.

In the embodiment of FIG. 6, the mold cap 602 includes a dimple-shape or recess design 604 (i.e., a decreased thickness near the center of the package). The decreased thickness near the center of the mold cap 602 can be advantageous for increasing the stiffness of the package 600 along its outer edge. This design can compensate for either "positive direction" or "negative direction" warpage.

As described above, the mold cap design is a function of the location of underlying components in the package. The package can include a plurality of die and/or other components. Each die or component can cause the package to warp, and through modeling and testing of prototype packages, an electronic package can be manufactured and assembled having a profiled or variable thickness mold cap to compensate for warpage. An exemplary package 700, for example, is shown in FIG. 7.

The electronic package 700 can include a plurality of underlying components 708 such as die. The package 700 is designed with a profiled or variable thickness mold cap 702 to compensate for warpage caused by the underlying components 708. In this embodiment, the mold cap 702 includes a pair of mound-shape portions 704 and a dimple-shape portion 706. In other embodiments, the package 700 can include one or more mound-shape portions 704 and/or dimple-shape portions 706. The location of the increased or decreased thickness of the mold cap 702 depends on the location of the underlying components 708 in the package 700. By designing the package 700 with a variable thickness mold cap 702, the net warpage of the package 700 can be substantially reduced or eliminated. As such, the package 700 remains substantially flat (i.e., without warping) and can be coupled, for example, to a printed circuit board mount or another substrate without detaching therefrom due to warpage.

Figure 7:
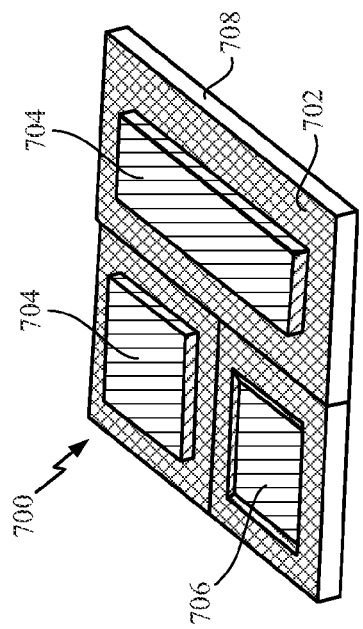
FIG. 7 is a perspective view of a combined mound-shape and dimple-shape mold cap.

Another advantage of the package of FIG. 7 is that no additional material or assembly step is required to fabricate and assemble the package. A mold compound is used in conventional packages to protect the package and its components from moisture and other environmental contaminants. By varying the thickness of the mold compound along its outer surface, the mold cap can also be used to protect the package from warpage.

In addition, many of the same manufacturing and assembly steps required for fabricating and assembling the package remain the same. The mold compound is applied to the package at the strip level, e.g., before cutting or dicing the strip of packages into singulated unitary packages. Thus, the processing steps are similar or the same as for manufacturing and assembling a conventional package.

Another advantage of the above-described embodiments is the ability to reduce or prevent warpage at the unit level. As described above, most conventional packages are designed and fabricated to overcome warpage at the strip level. Since electronic packages can warp while being fabricated on a carrier tape or strip, most previous solutions have focused on controlling warpage at the strip level. While this is a concern, electronic packages can also warp after being cut or diced into singulated unitary packages. The above-described embodiments can compensate for warpage at the unit level and therefore overcome many of the disadvantages associated with conventional packages.

Figure 8:
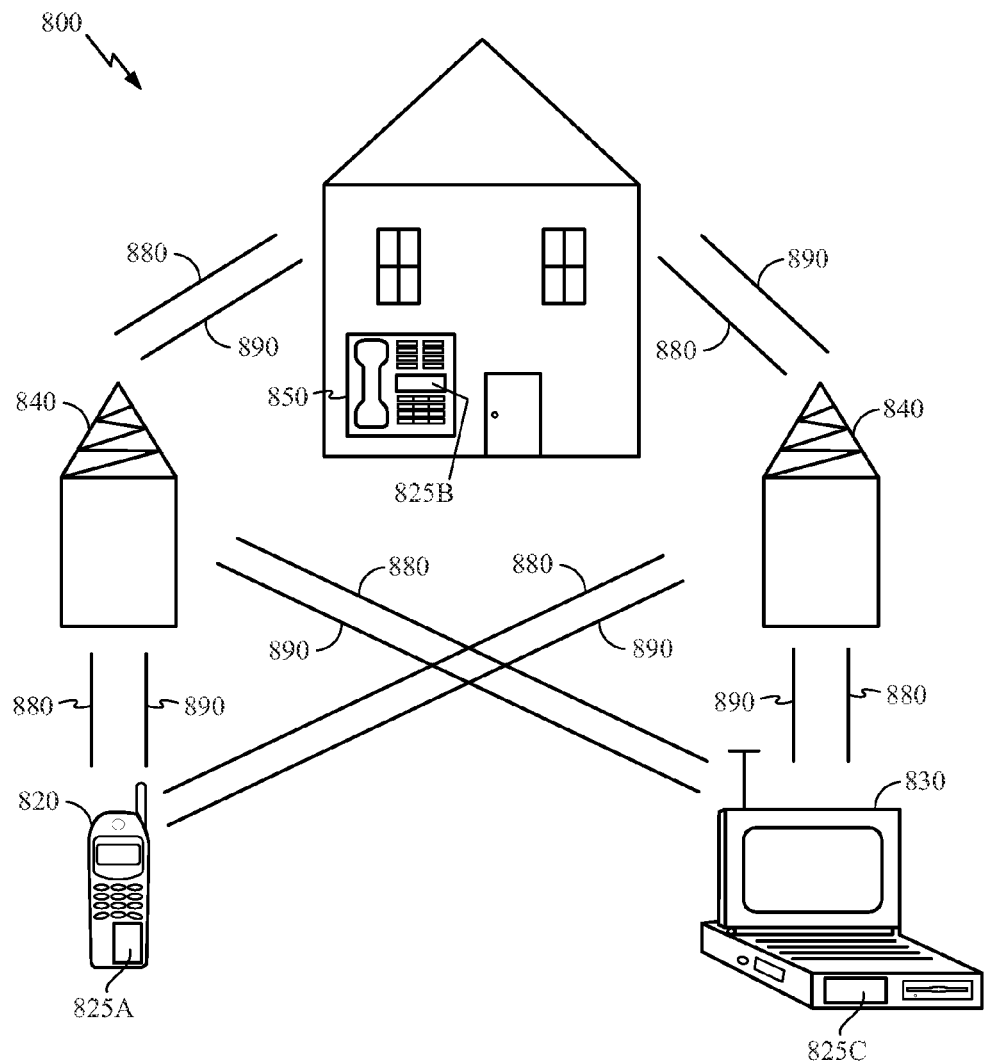
FIG. 8 is a block diagram showing an exemplary wireless communication system in which it may be advantageous to use an electronic package having a variable thickness mold cap.

FIG. 8 shows an exemplary wireless communication system 800 in which an embodiment of an electronic package having a variable thickness mold cap may be advantageously employed. For purposes of illustration, FIG. 8 shows three remote units 820, 830, and 850 and two base stations 840. It should be recognized that typical wireless communication systems may have many more remote units and base stations. Any of remote units 820, 830, and 850, as well as the base stations 840, may include an electronic package 825A, 825B, and 825C having a variable thickness mold cap such as disclosed herein. FIG. 8 shows forward link signals 880 from the base stations 840 and the remote units 820, 830, and 850 and reverse link signals 890 from the remote units 820, 830, and 850 to base stations 840.

In FIG. 8, remote unit 820 is shown as a mobile telephone, remote unit 830 is shown as a portable computer, and remote unit 850 is shown as a fixed location remote unit in a wireless local loop system. For example, the remote units may be cell phones, hand-held personal communication systems (PCS) units, portable data units such as personal data assistants, or fixed location data units such as meter reading equipment. Although FIG. 8 illustrates certain exemplary remote units that may include an electronic package having a variable thickness mold cap as disclosed herein, the package is not limited to these exemplary illustrated units. Embodiments may be suitably employed in any electronic device in which an electronic package having a variable thickness mold cap is desired.

While exemplary embodiments incorporating the principles of the present invention have been disclosed hereinabove, the present invention is not limited to the disclosed embodiments. Instead, this application is intended to cover any variations, uses, or adaptations of the invention using its general principles. Further, this application is intended to cover such departures from the present disclosure as come within known or customary practice in the art to which this invention pertains and which fall within the limits of the appended claims.

What is claimed is:

1. A method of reducing unit warpage of an electronic package having a substrate, comprising:
    placing an overmold having a plurality of heights over the electronic package, the electronic package comprising a plurality of components formed on a substrate, wherein the plurality of heights are selected to reduce either positive/convex direction or negative/concave direction warpage of each of the plurality of components;
    applying a molding compound between the substrate and the plurality of components of the electronic package and the overmold; and
    reducing unit warpage by allowing the molding compound to form a mold cap having a plurality of thicknesses.

2. The method of claim 1, further comprising varying the thickness of the mold cap.

3. The method of claim 2, further comprising making the thickness near the center of the mold cap thicker than near the edge of the mold cap.

4. The method of claim 2, further comprising making the thickness near the edge of the mold cap thicker than near the center of the mold cap.

5. The method of claim 2, further comprising varying the thickness of the mold material based on the underlying plurality of components within the package.

6. The method of claim 1, further comprising varying the stiffness of the package.

7. The method of claim 1 incorporated into a device selected from a group consisting of a music player, a video player, an entertainment unit, a navigation device, a communications device, a personal digital assistant (PDA), a fixed location data unit, and a computer.

8. A method of fabricating a singulated unitary electronic package with reduced unit warpage, comprising:
    providing an electronic package comprising a plurality of singulated unitary packages having a plurality of components;
    enclosing the electronic package with a mold material;
    forming the surface contour of the mold material to reduce unit warpage of each of the plurality of components, wherein the contour is designed to reduce either positive/convex direction or negative/concave direction warpage of each of the plurality of components, the plurality of components underlying the mold material; and
    cutting the electronic package into the plurality of singulated unitary packages.

9. The method of claim 8, further comprising increasing the thickness of the mold material near the center or an edge of one of the plurality of singulated unitary packages.

10. The method of claim 8, wherein the formed surface contour includes a mound shape with increased thickness or dimple shape.

11. The method of claim 8, further comprising varying the stiffness of the package.

12. The method of claim 8, further comprising varying the thickness of the mold material based on the underlying components within the package.

13. The method of claim 8 incorporated into a device selected from a group consisting of a music player, a video player, an entertainment unit, a navigation device, a communications device, a personal digital assistant (PDA), a fixed location data unit, and a computer.

14. A method of forming a singulated unitary electronic package, comprising:
    providing an electronic package comprising a plurality of singulated unitary packages having a plurality of components;
    enclosing the electronic package with a mold material;
    reducing unit warpage of each of the plurality of components, including compensating for either positive/convex direction or negative/concave direction warpage of each of the plurality of components, the plurality of components underlying the mold material; and
    separating the electronic package into the plurality of singulated unitary packages.

15. The method of claim 14, further comprising varying the stiffness of the package.

16. The method of claim 14, further comprising varying the thickness of the mold material based on the underlying plurality of components within the package.

17. The method of claim 14 incorporated into a device selected from a group consisting of a music player, a video player, an entertainment unit, a navigation device, a communications device, a personal digital assistant (PDA), a fixed location data unit, and a computer.

* * * * *